US007059246B2

(12) United States Patent
Riepenhoff et al.

(10) Patent No.: US 7,059,246 B2
(45) Date of Patent: Jun. 13, 2006

(54) PROCESS FOR OBTAINING IMAGE INFORMATION OF AN ILLUSTRATED PRINTING FORM, DEVICE FOR THIS AND PRINTING PRESS

(75) Inventors: Matthias Riepenhoff, Bern (CH); Reinhold Güth, Oberrohrdorf (CH)

(73) Assignee: Maschinenfabric WIFAG, Bern (CH)

( * ) Notice: Subject to any disclaimer, the term of this patent is extended or adjusted under 35 U.S.C. 154(b) by 0 days.

(21) Appl. No.: 10/397,348

(22) Filed: Mar. 26, 2003

(65) Prior Publication Data

US 2003/0183105 A1 Oct. 2, 2003

(30) Foreign Application Priority Data

Mar. 27, 2002 (DE) ................................ 102 13 802

(51) Int. Cl.
*B41F 1/16* (2006.01)
*B41F 7/02* (2006.01)
*G03F 7/26* (2006.01)

(52) U.S. Cl. .................... 101/451; 101/450.1; 101/465

(58) Field of Classification Search ............. 101/450.1, 101/451, 452, 463.1, 465, 466, 467, 478; 430/302
See application file for complete search history.

(56) References Cited

U.S. PATENT DOCUMENTS 4,266,481 A * 5/1981 Garrett et al. .............. 101/456
4,340,509 A * 7/1982 Canale et al. ............... 510/172
4,718,340 A * 1/1988 Love, III .................... 101/116
5,127,330 A 7/1992 Okazaki et al.
5,191,834 A * 3/1993 Fuhrmann et al. .......... 101/130
5,555,809 A * 9/1996 Hirt et al. .................. 101/451
5,713,287 A 2/1998 Gelbart
5,816,164 A * 10/1998 Loffler ........................ 101/484
6,079,331 A * 6/2000 Koguchi et al. ............ 101/467

(Continued)

FOREIGN PATENT DOCUMENTS

DE 38 21 268 A1 12/1989
DE 42 35 242 C1 11/1993
DE 196 12 927 A1 11/1996

(Continued)

OTHER PUBLICATIONS

H. Kipphan, Computer to Press/Direct Imaging, Handbuch der Printmedien (ISBN 3-540-66941-8).

*Primary Examiner*—Andrew H. Hirshfeld
*Assistant Examiner*—Joshua Zimmerman
(74) *Attorney, Agent, or Firm*—McGlew & Tuttle, P.C.

(57) ABSTRACT

A process is provided for obtaining or refreshing the illustration of a printing form, preferably in wet-offset printing. Instead of clearing the illustration over the entire area, the printing form is acted on during the production. For this, a processing agent can act on the printing form in different areas for images. A processing agent preferably acts over the entire area of the printing form, in which case the layer of ink located on the printing form leads to a locally different intensity of the action, corresponding to the illustration of the printing form. Photocatalytic effects are preferably used. A hydrophilization of non-image areas is brought about by irradiation in the presence of water molecules. Since printing ink containing little water lies on the image areas, hydrophilization cannot occur on the image areas. Thus, in spite of the entire-area action on the printing form, an image-related refreshing or obtaining of the illustration is automatically achieved. A device is also provided for carrying out the process and a printing press with such a device, especially a wet-offset rotary printing press in the printing of newspaper print runs.

17 Claims, 2 Drawing Sheets

U.S. PATENT DOCUMENTS

| | | | | |
|---|---|---|---|---|
| 6,146,798 | A * | 11/2000 | Bringans et al. | 430/49 |
| 6,318,264 | B1 | 11/2001 | D'Heureuse et al. | |
| 6,477,955 | B1 * | 11/2002 | Landsman | 101/457 |
| 6,694,880 | B1 | 2/2004 | Mori et al. | |
| 6,742,454 | B1 * | 6/2004 | Murray | 101/401.1 |
| 2002/0139269 | A1 | 10/2002 | Riepenhoff et al. | 101/453 |

FOREIGN PATENT DOCUMENTS

| | | | |
|---|---|---|---|
| DE | 198 26 377 | A1 | 12/1999 |
| DE | 101 15 435 | A1 | 10/2002 |
| EP | 0 402 942 | A2 | 12/1990 |
| EP | 1 020 304 | A2 | 7/2000 |
| EP | 1 090 750 | A2 | 4/2001 |

* cited by examiner

PROCESS FOR OBTAINING IMAGE INFORMATION OF AN ILLUSTRATED PRINTING FORM, DEVICE FOR THIS AND PRINTING PRESS

FIELD OF THE INVENTION

The present invention pertains to a process for obtaining image information of an illustrated printing form and a device for carrying out the process. Further, the present invention pertains to a printing press, in which such a process is used, especially in wet-offset web-fed rotary printing, especially in the printing of newspaper print runs.

BACKGROUND OF THE INVENTION

Newspapers are mainly produced in wet offset printing systems. Printing presses, as the present invention preferably pertains to them, typically contain printing mechanisms with rubber blanket cylinders, plate cylinders, inking mechanisms and moistening mechanisms. A printing form tensioned on a printing form cylinder has a surface mostly in the form of a top layer, which has hydrophilic (water-attractive) and hydrophobic (water-repellent) or lipophilic areas in the illustrated state. The printing form is usually formed by a printing plate, which is mounted on a printing form cylinder designed as a plate cylinder. The printing form has applied lipophilic areas for images. The non-image areas are hydrophilic and bind water more intensely than the ink used for printing. The lipophilic areas repel water and therefore have an ink-attractive action. In principle, any surface, which can be divided into hydrophilic and hydrophobic or lipophilic areas, can be used for the offset process.

An illustration is defined below as an operation, in which the printing form is acted on in the areas that form the image dots, so that an original corresponding to the printing image is produced on the printing form by the formation of hydrophilic and lipophilic areas. In terms of the present invention a clearing is defined as an operation, in which the printing form is preferably not treated depending on images, but rather over its entire area, such that the image information applied in the illustration, i.e., the printing image, is removed again.

A plurality of materials and processes exist for producing suitable printing forms or printing plates. It is possible, e.g., to radiate a printing form with a laser for images and then to chemically develop them. Printing forms can also be produced by means of laser ablation. In this case, either lipophilic areas under a hydrophilic layer or hydrophilic areas under a lipophilic layer are uncovered. Also, in terms of an image, material can be applied to a surface, e.g., with an ink jet process or by means of thermodiffusion and an offset printing form can thereby be created. The definitive operation for the illustration of the printing form may be carried out either in a separate facility or within the printing press.

At the moment, printing forms used in mass productions are only used once. However, processes of illustrating printing forms repeatedly and then clearing them again have also become known. In the case of clearing, the surface properties of the printing form are affected, such that the printing form is again made uniformly hydrophilic or hydrophobic over the entire area due to clearing, so that this printing form can be used again for a new illustration operation.

H. Kipphan: *Handbuch der Printmedien [Printing Media Manual*], Springer Verlag 2000, Chapter 4.4, Computer to Press/Direct Imaging, pages 654–686, gives a review of materials and mechanisms of action for illustrating printing forms by producing different hydrophobic and hydrophilic areas. The materials and processes disclosed there can basically be used in terms of the present invention, so that these materials and processes are expressly involved in this application by way of reference.

It is difficult to achieve high print runs, as they occur, e.g., in the printing of newspapers, with the clearable printing forms made of prior-art materials and with the prior-art illustrating and clearing process because it may occur during the print production that the areas of the printing form made hydrophilic or hydrophobic in an illustration gradually lose these surface properties. As a result, there may be a reduction in the contrast of the printing image. Thus, there may be, e.g., toning, if the hydrophilicity of areas made hydrophilic decreases and these areas take up more and more ink used for the printing.

The aforementioned problems exist not only in wet offset but also in dry offset because in dry offset as well, the printing process is based on the different ink transfer of image-related areas. It is well known that the print quality, especially the print run stability, depends greatly on the maintenance of the production parameters, e.g., the temperature. The ink transfer or repulsion is, indeed, not based on the different hydrophilicity or hydrophobicity of the printing form. Even so, a dry offset printing process is also based on interface processes. Thus, in dry offset as well, the obtaining of the surface properties of a printing form is of decisive importance for achieving high print runs.

SUMMARY OF THE INVENTION

The object of the present invention is to create a process and a device to make it possible in a simple manner to obtain the image information of a printing form and thus to make it possible to print high print runs. Moreover, a printing press using the process or device according to the present invention shall be created. A preferred application pertains to the obtaining of image information of clearable printing forms, preferably in offset printing, and more preferably in wet offset printing.

According to the present invention, the image information of an illustrated printing form is kept by acting on the illustrated printing form with the ink transferred to same, so that the surface properties of the printing form are obtained or are refreshed again corresponding to the illustration. Here, it is advantageous that the printing form, which can be described again, is not first cleared for retaining a sufficient print quality and then re-illustrated with fresh image information, but rather the surface properties that are responsible for the ink transfer, print quality, etc. are retained or refreshed again during production. Thus, the process according to the present invention makes possible high print runs with constant print quality. Since the printing form used does not have to be cleared and again described or replaced with another printing form, the production can preferably be run without any interruption with constant print quality.

Thus, the different hydrophobic and hydrophilic areas of the printing form which are responsible for producing the printing image are affected, such that the hydrophobic and hydrophilic properties of image-related areas of the illustrated printing form are modified with the printing ink transferred on it corresponding to the intensity of the action on the printing form, so that, all in all, the illustration is maintained on the printing form, The interface properties are especially preferably affected by the action on the illustrated printing form, which in turn may have an effect on the image transfer properties and/or the ink adhesion properties of the illustrated printing form, whereby the action is carried out such that the achievable print quality essentially remains constant.

According to an especially preferred embodiment, the action is carried out on the illustrated printing form during a production with a printing form cylinder rotating essentially at normal printing speed, such that no slowing down of the current production occurs. However, the action can basically also be carried out during a comparatively brief interruption in production, without the illustration being cleared and the printing form being re-illustrated. On the contrary, the printing form cylinder is rotated comparatively slowly, while the action is carried out on the printing form for obtaining the surface properties of the printing form responsible for the print quality.

The action on the printing form during the production is possible, for example, if the image data that form the printing image are transferred to actuators or processing agents which corresponding to the image data transferred, act specifically on the image areas or on the non-image areas of the printing form or the hydrophobic or hydrophilic areas. Examples of such action mechanisms are described in the *Handbuch der Printmedien* by H. Kipphan, loc. cit., so that the details may be omitted for the sake of clarity. The image-related action is especially preferably carried out during production with the printing form cylinder essentially stationary or rotating only slowly, since the actuators known at the moment are able to act on the printing form only comparatively slowly.

According to an especially preferred embodiment, however, the action is carried out essentially over the entire area of the printing form during production. This is described, e.g., based on a wet-offset printing process, in which, as is well known, a layer of ink is applied to image areas or hydrophobic sections of the printing form during the printing process; on the other hand, the non-image areas are not covered with printing ink. In the case of the wet-offset printing process, the action mechanism is selected to be such that the hydrophobic and hydrophilic sections of the printing form are affected differently based on the layer of ink applied, whereby the ink layer applied is used for the necessary differentiation of the action mechanism.

If an optical radiation acts, e.g., during the printing on a printing form that responds to the optical radiation, then the effect of the optical radiation on the non-image areas is different than that on the image areas, because the radiation is filtered for the images because of the ink layer applied to the printing form. Thus, in spite of the entire-area irradiation of the printing form, a different effect in terms of images on the image areas and non-image areas of the printing form automatically occurs because of the layer of ink applied.

Thus, two effects become noticeable, e.g., in wet offset, which may be further affected by means of suitable additions in the printing ink and moistening agents. If, e.g., a printing form is used, whose hydrophilicity was brought about by optical radiation, especially UV radiation, then a radiation, and especially in the UV range, acts, such that the hydrophilicity is constant. Since the non-hydrophilic or lipophilic image areas are covered with the printing ink, the action of the radiation, especially the UV radiation, is less on these areas (e.g., because of absorption or scattering effects in the printing ink). Thus, the image-related surface properties of the printing form are obtained automatically.

This effect is reinforced, if optical radiation acts on the printing form, whose frequency lies within an absorption band of the ink used for the printing. By means of suitable selection of the maximum absorption band, the spectral range of the absorption band, as well as the frequency of the optical radiation used, the image-related obtaining of the interface properties of the printing form can be optimally adapted to the operating conditions.

The aforementioned radiation absorption can also be used to suppress the hydrophilization of these areas because of a local heating based on the absorption in the ink areas above the image areas. It is basically possible to also use optical radiation with different wavelengths for such a local different heating, e.g., with wavelengths in the visible wavelength range or in the infrared wavelength range, as long as the optical radiation is sufficiently absorbed by the pigments or the other components of the printing ink used, e.g., by additives. These additives may absorb, e.g., only in the UV range and thus have no effect on the print quality.

According to a preferred embodiment, a printing form is used, in which permanent hydrophilization can be achieved on the surface, e.g., by means of photocatalysis. A printing form that can be made hydrophilic by means of UV radiation has become known from the likewise pending German patent application DE 101 15 435.6 of the applicant, whose contents are expressly incorporated into the present application by way of reference. There is an excitation of the atoms in a higher state of energy that makes possible an interaction with water molecules from the environment. If water is present in the environment, e.g., moisture, the water binds to the surface of the printing form, as a result of which this surface retains hydrophilicity, even after the irradiation is interrupted. However, if no water is present in the environment, these atoms return to their original state of energy and do not remain permanently hydrophilic. If such a printing form according to the present invention is used in a wet offset printing process, then the non-image areas are covered with a film of water; the image areas, on the other hand, are covered with an oily layer of ink, which contains only relatively little water. If the entire area of such a printing form is irradiated with optical radiation, especially UV radiation, with image-related ink adhering thereto, then the UV radiation reaches not only the ink-free, non-image areas, but also reaches the image areas through the layer of ink (apart from the absorption and scattering effects) and it may, in principle, excite the surface of the printing form. However, comparatively little water is present in the environment of the surface on the image areas, i.e., the areas of the printing form covered with ink, so that no permanent hydrophilization can be brought about on these areas. However, a permanent hydrophilization can be brought about, or refreshed, on the non-image areas covered with a film of water. Thus, in spite of an entire-area action on the offset printing form, an image-related refreshing or obtaining of the image information of the illustrated printing form is achieved according to the present invention. Thus, the surface properties of the printing form that are relevant for the print quality can remain constant.

In this case, the wavelength of the optical irradiation, the absorption wavelength of the printing ink and the range of the absorption of the ink are basically available as parameters. These parameters can be correspondingly adjusted by changing the light wavelength or by means of additives to the ink in order to make possible an optimal, image-related refreshing of the illustration with entire-area irradiation of the printing form.

Other physical and chemical effects may basically also be used in order to obtain the illustration of the printing form in entire-area action. For example, an electrical field or an electrostatic potential can be applied to the surface of the printing form, e.g., by means of a high-voltage electrode applied at a uniform, short distance to the surface of the printing form. The action of an electrical field or electrostatic potential is also different on image areas and non-image areas and may be made use of according to the present invention. Additives may make the moistening agent used in the wet-offset printing process conductive, such that charges, which form on sections of the printing form surface not covered with printing ink, can be diverted, while the insulating, oily printing ink without such an additive stops the charges from being diverted. Thus, the insulating, oily printing ink remains electrostatically charged. Thus, in spite of entire-area action on the printing form by means of an electrical field or electrostatic potential, an image-related action can be achieved, such that, e.g., the ink adhesion properties and/or the image transfer properties from the printing form to a subordinate cylinder, e.g., a rubber blanket cylinder, can be modified in terms of images.

The surface of the printing form may also contain ferroelectric materials, e.g., ceramics, ceramic multilayer systems or even polymers, as they are known from the state of the art for direct imaging systems. The orientation of the ferroelectric materials can be changed in an image dot manner by applying a sufficient electrical field intensity. Based on the known hysteresis curve that describes the dependence of the polarization on the electrical field intensity, the ferroelectric material can be present usually in three distinct states, which are designated as electrically positive, electrically negative and neutral, and between which the material can be switched back and forth, whereby the states are all stable. The layer of ink adhering to the printing form can basically be treated as a dielectric layer. The dielectricity constant of the layer of ink can be further reinforced by dielectric additives. Thus, the active dielectric shift D is different on image areas and non-image areas, such that, in spite of entire-area application of an electrostatic potential or electrical field, an image-related effect on the surface properties of the printing form can be brought about in order to modify ink adhesion properties and/or image transfer properties in an image-related manner.

An image-related action on the printing form can also be achieved by loading the entire area of the printing form with chemical substances and/or gas and/or vapor. To this end as well, advantage is taken of the fact that the ink applied to the printing form adheres to same for images, such that the image areas are covered with a layer of ink, while the non-image areas are essentially not covered. Thus, the chemical substances, gas or vapor may only reach the non-image areas in contact with the surface of the printing form or in contact with the film of moisture located above it in the wet-offset printing. The chemical substance, gas or vapor applied should be selected according to the present invention such that interface properties of the printing form are modified at these areas, such that the information (non-image area) is locally constant. Suitable chemical substances, gases or vapors are apparent to the person skilled in the art upon studying this application.

Of course, this action mechanism may also be combined with other action mechanisms. Thus, e.g., the chemical substance may be sprayed on in the form of a liquid or as an additive to a liquid over the entire area or be applied to the entire area by means of a moistening mechanism. Because of the layer of ink applied for the images, the liquid reaches only the non-image areas in contact with the surface of the printing form. If the printing form is selected to be such that a hydrophilization of the surface can be brought about by means of photocatalysis or other optical effects, the liquid which is needed for the hydrophilization is automatically available at the non-image areas. Thus, by means of suitable radiation, the hydrophilization of the non-image areas is obtained in a suitable manner.

Another example is the feeding of an air stream onto the surface of the printing form. Especially in wet offset, the evaporation of moisture that lies on the non-image areas can be promoted by means of an air stream. Thus, on these areas, heat of evaporation is removed from the printing form, and the printing form surface is cooled locally. The cooling effect is smaller on the image areas, if the printing ink evaporates less intensely, and it is greater, if the printing ink contains highly volatile substances. Thus, in spite of entire-area charging of the printing form surface with the air stream, an image-related effect on the parameters relevant for the print quality can be achieved, e.g., the ink adhesion properties and/or ink transfer properties of the printing form.

Of course, a chemical substance may be mixed with the air stream that enhances or moderates the above-mentioned effects.

The present invention will be described below by way of an example with reference to the attached figures. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
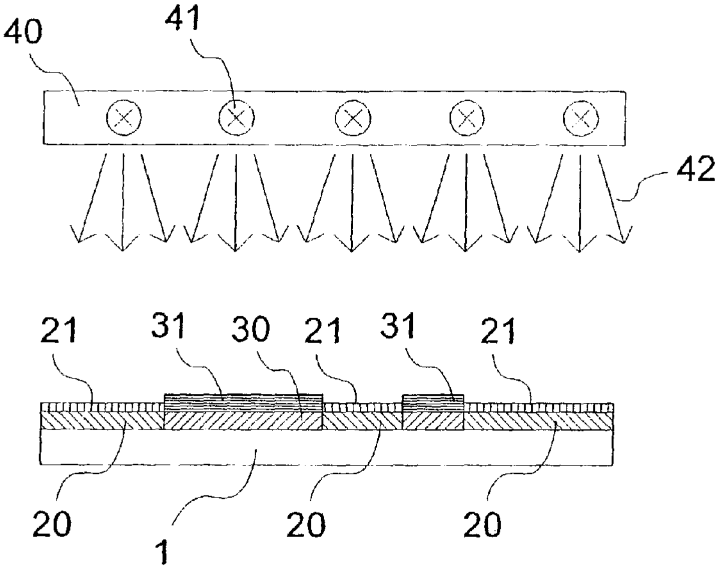
FIG. 1 is a schematic view showing a process according to the present invention.

Referring to the drawings in particular, FIG. 1 schematically shows a process according to the present invention. On a carrier of the printing form 1 are located hydrophilic areas 20 and hydrophobic areas 30 applied for images which are formed on the printing form by means of a prior-art process. E.g., the printing form 1 may have a photocatalytically and/or thermally changeable material, as disclosed, e.g., in DE 101 15 435. The hydrophilic and hydrophobic areas may also be produced, e.g., by laser ablation, an ink jet process, toner application, polarization of ferroelectric materials of the printing form or by means of locally different image-related heat addition. In a wet-offset printing process, as it is based on FIG. 1 by way of example, a layer of water 21 is located on the hydrophilic areas, while a layer of ink 31 is on the hydrophobic areas 30. An illustration corresponding to the current print production is applied to the surface of the printing form 1 in the form of the different hydrophilic and hydrophobic areas 20, 30, and especially in the form of areas having different surface properties.

Close to the surface of the printing form 1 is located a processing agent 41 which acts on the surface of the printing form 1 in order to obtain or to refresh the image information of the illustration of the printing form 1. As is shown in FIG.

1, the processing agent comprises a number of processing agent actuators, for instance, a plurality of single light source, 41, which are preferably arranged in the axial direction of the printing form 1 essentially at a constant distance from same in order to guarantee a uniform action on the printing form 1.

According to a first embodiment, the processing agent 40 may act on the printing form 1 for images. Due to the action, the hydrophilic properties of the hydrophilic areas 20 are refreshed or obtained, and/or the hydrophobic properties of the hydrophobic areas 30 are obtained or are refreshed. The image information necessary for this is applied to the processing agent 40 in a known manner, e.g., as a bitmap file, and is used for the image-related actuation of the processing agent actuators 41 being used as actuators, which act locally on the printing form surface corresponding to the image information of the illustration.

According to a second embodiment, the processing agent 40 acts over the entire area of the surface of the printing form 1. Since the surface of the printing form 1 includes both areas that are covered with a layer of ink 31 and areas that are not covered with a layer of ink, e.g., those sections covered with the film of moisture 21, the action on the surface of the printing form 1 will be different locally. Thus, in spite of the entire-area action, the surface is automatically acted on in an image-related manner. The physical and/or chemical effect on which the action is based must be selected only such that the action is weakened or strengthened by the layer of ink 31 adhering to the surface of the printing form 1. Suitable physical and/or chemical effects will become apparent to the person skilled in the art upon studying the present application.

Figure 2:
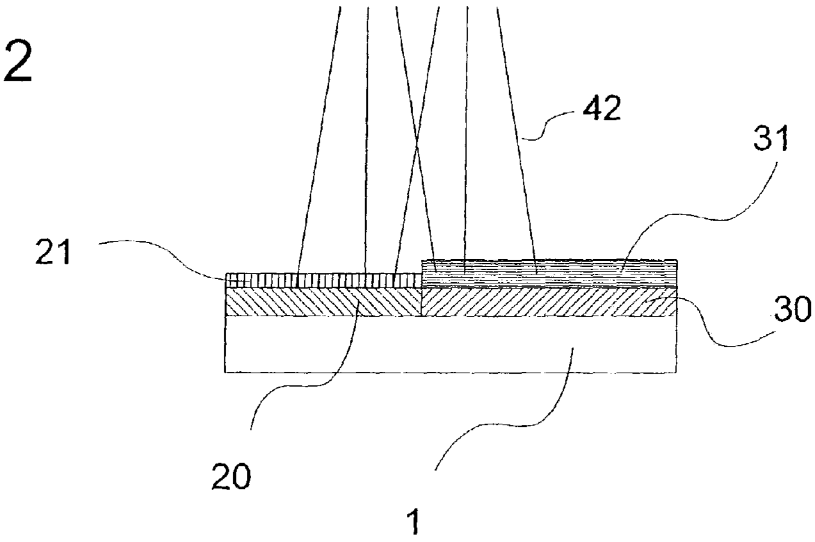
FIG. 2 is an enlarged cutout of the printing form according to FIG. 1.

According to a preferred embodiment, the processing agent 40 is a light source having a number of single light sources 41 (e.g., LEDs or laser diodes with assigned projection lenses), which irradiate the surface of the printing form 1 uniformly and over its entire area. The light source 40 is, in this case, aligned in a strip parallel to the printing form 1 and illuminates a strip-shaped section of the printing form 1. The irradiation brings about a locally different modification of parameters relevant for the print quality, e.g., the ink adhesion properties and/or ink transfer properties of the printing form 1. It is necessary for this that interface properties of the printing form 1 be suitably modified by the interaction of the printing form surface with the optical radiation 42. For this, the printing form 1 preferably comprises a material that can be transferred photocatalytically into a hydrophilic state by means of irradiation with light and thermally into a lipophilic state, namely by heating. The optical radiation 42, which is essentially unhindered on the surface of the printing form 1, reaches the sections covered with the film of water 21. Atoms are excited there locally into higher states of energy. This leads to an interaction with the water molecules present in the environment, namely in the film of water 21. This leads to the hydrophilic properties of the sections 20 being refreshed and constant. However, the layer of ink 31, which contains relatively few water molecules, prevents enough water molecules from being available on the areas 30 to be able to bring about a hydrophilization of the surface sections 30 by means of the photocatalytic effect. Thus, the hydrophobic areas 30 remain hydrophobic. A possible hydrophilization of the areas 30, e.g., because of residual moisture in the printing ink, can be stopped even more greatly, if the wavelength of the optical radiation 42 is selected to be such that it lies in an absorption band of the color contained in the layer of ink 31 and/ or an additive contained therein. The optical radiation 42 is especially preferably UV light and the absorption band lies in the ultraviolet spectral range. Thus, in spite of entire-area irradiation of the surface of the printing form, the illustration can be obtained or refreshed. In the enlarged partial section according to FIG. 2, this effect can be clearly seen.

The printing form 1 may be acted on by means of the processing agent 40 either continuously or in an intermittent manner. For example, a fixed program may predetermine that the action is switched on at constant time intervals or after the printing of a predetermined number of printed copies or a predetermined length of printing material for a predetermined time interval. The time interval may be varied depending on the properties of the current print production.

Both in a continuous and in an intermittent action on the printing form 1, the intensity and/or time duration of the action may be adjusted by means of an automatic control or regulation. Thus, e.g., an operator may first manually set the conditions of the action, especially the intensity and/or time duration, corresponding to the expected production conditions or those to be achieved. Then, the further adjustment of the relevant parameters can be transferred to automatic control or regulation. This control automatically makes an adjustment of the intensity and/or time duration of the action based on measurements. The parameters to be adjusted depend on the action mechanism on which the action is based. If the action is carried out, e.g., by optical radiation, then the wavelength and/or intensity and/or focusing and/or polarization and/or time duration and/or modulation of the optical radiation can be varied.

Some measurement variables which can be used as input quantities for the control or regulation are given below by way of example: Printed copies or the printed web may be measured by means of optical sensors in order to evaluate the print quality; for this, knowing the printed image information selected sections can be measured, based on which the print quality can be suitable evaluated. The examples do not or only slightly represent sections to be printed, which provide information about the so-called toning of the printing form or of the rubber blanket cylinder. Another example are the transition areas between slightly printed areas and heavily printed areas, from which information on contrast can be derived. Another example are test patterns, which are printed, e.g., on the edge of the current print production. Measurement variables may also be derived directly from the printing form and may later also be removed, e.g., separated. For example, the electrostatic charging of the printing form may be measured, or the light scattering or degree of coverage of the printing form surface with ink may be measured by reflection measurement in order to obtain information about the interface properties of the surface of this printing form.

According to another embodiment, the action can also be based on another physical and/or chemical effect. Suitable action mechanisms will become apparent to the person skilled in the art in this field on studying the present application. The illustration may especially be obtained or refreshed in the above-mentioned manner by applying an electrical field or electrostatic potential and/or a magnetic field to the printing form 1 and/or by the action of heat and/or a gas and/or blast air and/or a liquid and/or a vapor on the printing form 1.

Figure 3:
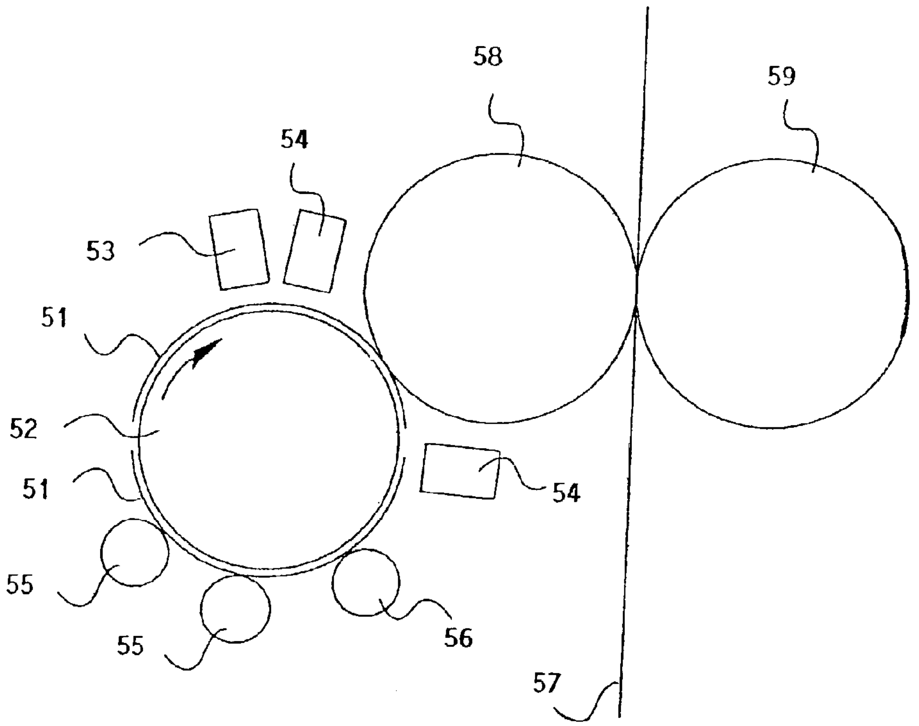
FIG. 3 is a schematic view showing a printing mechanism of a wet-offset rotary printing press.

FIG. 3 schematically shows a printing unit for the process according to the present invention. This printing unit comprises a printing form cylinder 52, an assigned rubber blanket cylinder 58 and a counter-pressure cylinder 59, which forms a print aperture for a web 57 to be printed on with the rubber blanket cylinder 58. Two printing plates 51 are attached to the printing form cylinder 52 in a known manner. However, each of the two printing plates 51 is formed by a printing form according to the present invention, as shown, e.g., in FIGS. 1 and 2. An imaging device 53 for the illustration, ink application rollers 55 and a moisture application roller 56 are arranged distributed about the circumference of the printing form cylinder 52 in the printing press. A moistening agent film, preferably a film of water is guided to the printing forms 51 via the moisture application roller 56 in a known manner. By means of the ink application rollers 55, ink is transferred to the printing forms 51 for images in a likewise known manner during the printing, which is transferred from the hydrophobic or lipophilic image areas of the printing forms 51 first to the rubber blanket cylinder 58 and from this to the web of print material 57. The counter-pressure cylinder 59 may itself be a rubber blanket cylinder of another printing unit for two-sided printing, a steel cylinder for only a single print position or a steel cylinder of a satellite printing mechanism, e.g., a 9- or 10-cylinder printing mechanism.

Furthermore, a processing agent 54 is provided, which acts on the printing form cylinder 52 in the above-mentioned manner. Moreover, clearing devices (not shown) may be provided in a known manner in order to clear the illustration on the printing plates.

The processing agent 54 is turned directly towards the surface to be illustrated of the printing form 51 and is arranged parallel to the axis of rotation of the printing form cylinder 52. Thus, an entire-area action on the surface of the printing form cylinder 52 can be achieved. During the illustration and the print production, the clearing devices (not shown) are switched off. During print production the processing agent 54 acts continuously or intermittently in the manner described above on the surface of the printing form cylinder 52 in order to refresh or obtain the illustration provided on the printing plates 51. The illustration is preferably refreshed or obtained with the printing form cylinder 52 rotating essentially at the normal printing speed. The print production can also be briefly interrupted, and the rotational speed of the printing form cylinder 52 can be markedly decreased or brought to a standstill in order to refresh or obtain the illustration by means of the processing agent 54. This procedure is also especially suitable for an image-related refreshing or obtaining of the illustration, so that the duration of the action can be sufficiently selected. Also for the refreshing or obtaining of the illustration, the clearing devices (not shown) preferably remain switched off, and a layer of printing ink is applied to the image areas, which makes it possible to obtain or refresh the illustration according to the present invention in spite of entire-area action on the printing form cylinder 52 or the printing forms 1.

While specific embodiments of the invention have been shown and described in detail to illustrate the application of the principles of the invention, it will be understood that the invention may be embodied otherwise without departing from such principles.

What is claimed is:

1. An offset printing process for maintaining image information of an illustrated printing form, the process comprising:

providing the illustrated printing form having areas with different surface properties;

transferring ink corresponding to an illustration to the illustrated printing form; and acting essentially over the entire area of the illustrated printing form with the ink transferred to the illustrated printing form, for at least one of refreshing and maintaining surface properties of the printing form corresponding to the illustration, wherein upon the acting on the illustrated printing form, hydrophobic and/or hydrophilic properties of image-related areas of the illustrated printing form are modified corresponding to an intensity of an exposure.

2. An offset printing process for maintaining image information of an illustrated printing form, the process comprising:

providing the illustrated printing form having areas with different surface properties;

transferring ink corresponding to an illustration to the illustrated printing form; and acting essentially over the entire area of the illustrated printing form with the ink transferred to the illustrated printing form, for at least one of refreshing and maintaining surface properties of the printing form corresponding to the illustration, wherein the acting on the illustrated printing form is carried out during a production with the printing form cylinder carrying the illustrated printing form essentially stationary or rotating only slowly.

3. An offset printing process for maintaining image information of an illustrated printing form, the process comprising:

providing the illustrated printing form having areas with different surface properties;

transferring ink corresponding to an illustration to the illustrated form; and acting on the illustrated printing form with the ink transferred to the illustrated printing form in an image-related manner, for at least one of refreshing and maintaining surface properties of the printing form corresponding to the illustration.

4. An offset printing process for maintaining image information of an illustrated printing form, the process comprising:

providing the illustrated printing form having areas with different surface properties;

transferring ink corresponding to an illustration to the illustrated printing form; and acting essentially over the entire area of the illustrated printing form with the ink transferred to the illustrated printing form, for at least one of refreshing and maintaining surface properties of the printing form corresponding to the illustration, wherein the intensity and/or the time duration of the acting on the illustrated printing form is adjusted.

5. A process in accordance with claim 4, in which the intensity and/or the time duration of the acting on the illustrated printing form is adjusted by an automatic control or regulation.

6. A process in accordance with claim 5, further comprising:

providing an optical sensor, in which the control or regulation is carried out based on an evaluation of printed copies or a printed web.

7. An offset printing process for maintaining image information of an illustrated printing form, the process comprising:

providing the illustrated printing form having areas with different surface properties;

transferring ink corresponding to an illustration to the illustrated printing form; and acting essentially over the entire area of the illustrated printing form with the ink transferred to the illustrated printing form, for at least one of refreshing and maintaining surface properties of the printing form corresponding to the illustration, in which an electromagnetic radiation in the visual wavelength range, is used for the acting on the illustrated printing form.

8. A process in accordance with claim 7, wherein the electromagnetic radiation comprises at least UV fractions.

9. A process in accordance with claim 7, wherein the radiation has spectral fractions in an absorption band of an ink used, which is transferred to the printing form.

10. A device for at least one of obtaining and maintaining image information of an illustrated printing form by providing the illustrated printing form having areas with different surface properties transferring ink corresponding to an illustration to the illustrated printing form and acting essentially over the entire area of the illustrated printing form with the ink transferred to the illustrated printing form, for at least one of refreshing and maintaining surface properties of the printing form corresponding to the illustration, the device comprising:

a printing form for illustration:

an inking mechanism for transferring ink to the surface of the illustrated printing form; and a processing agent for acting on the illustrated printing form, onto which said ink was transferred thereto in order to obtain the surface properties of the printing form corresponding to the illustration of the printing form, wherein the processing agent modifies, by means of the action, the hydrophobic and/or hydrophilic properties of image-related areas of the illustrated printing form corresponding to an intensity of an exposure.

11. A device for at least one of obtaining and maintaining image information of an illustrated printing form by providing the illustrated printing form having areas with different surface properties transferring ink corresponding to an illustration to the illustrated printing form and acting essentially over the entire area of the illustrated printing form with the ink transferred to the illustrated printing mint for at least one of refreshing and maintaining surface properties of the printing form corresponding to the illustration, the device comprising:

a printing form for illustration;

an inkinq mechanism for transferring ink to the surface of the illustrated printing form; and a processing agent for acting on the illustrated printing form onto which said ink was transferred thereto in order to obtain the surface properties of the printing form corresponding to the illustration of the printing form, wherein the processing agent is designed, so that the action is carried out in an image-related manner on the printing form with the ink transferred onto it.

12. A device for at least one of obtaining and maintaining image information of an illustrated printing form by providing the illustrated printing form having areas with different surface properties, transferring ink corresponding to an illustration to the illustrated printing form and acting essentially over the entire area of the illustrated printing form with the ink transferred to the illustrated printing form, for at least one of refreshing and maintaining surface properties of the printing form corresponding to the illustration, the device comprising:

a printing form for illustration;

an inking mechanism for transferring ink to the surface of the illustrated printing form; and a processing agent for acting on the illustrated printing form, onto which said ink was transferred thereto in order to obtain the surface properties of the printing form corresponding to the illustration of the printing form, further comprising a control means or regulating means for adjusting the intensity and/or time duration of the action on the printing form.

13. A device in accordance with claim 12, further comprising:

an optical sensor, wherein the control or regulating means performs the control or regulation based on an evaluation of printed copies or a printed web by said optical sensor.

14. A device for at least one of obtaining and maintaining image information of an illustrated printing form by providing the illustrated printing form having areas with different surface properties, transferring ink corresponding to an illustration to the illustrated printing form and acting essentially over the entire area of the illustrated printing form with the ink transferred to the illustrated printing form, for at least one of refreshing and maintaining surface properties of the printing form corresponding to the illustration, the device comprising:

a printing form for illustration;

an inking mechanism for transferring ink to the surface of the illustrated printing form; and a processing agent for acting on the illustrated printing form, onto which said ink was transferred thereto in order to obtain the surface properties of the printing form corresponding to the illustration of the printing form, wherein the processing agent is a light source.

15. A device in accordance with claim 14, wherein the processing agent is a UV light source.

16. A process in accordance with claim 5, in which the control or regulation is carried out based on an evaluation of printed copies or a printed web performed by an evaluating means.

17. A device in accordance with claim 12, wherein the control or regulating means performs the control or regulation based on an evaluation of printed copies or a printed web carried out by an evaluating means.

* * * * *